(12) United States Patent
Larguier et al.

(10) Patent No.: US 7,403,442 B2
(45) Date of Patent: Jul. 22, 2008

(54) PULSE CONTROLLED WORD LINE DRIVER

(75) Inventors: Jean-Yves Larguier, Xi'an (CN);
Michael Yap San Min, Valbonne (FR);
Damien Bretegnier, Villiers le Morhier (FR)

(73) Assignee: Infineon Technologies AG, Munich (DE)

( * ) Notice: Subject to any disclaimer, the term of this patent is extended or adjusted under 35 U.S.C. 154(b) by 119 days.

(21) Appl. No.: 11/331,408

(22) Filed: Jan. 12, 2006

(65) Prior Publication Data

US 2006/0198231 A1 Sep. 7, 2006

(30) Foreign Application Priority Data

Jan. 12, 2005 (EP) ................................. 05000540

(51) Int. Cl.
*G11C 8/00* (2006.01)
(52) U.S. Cl. ............................. 365/230.06; 365/185.23; 365/185.25
(58) Field of Classification Search ............. 365/230.06
See application file for complete search history.

(56) References Cited

U.S. PATENT DOCUMENTS

| | | | |
|---|---|---|---|
| 4,516,224 A | 5/1985 | Aoyama | |
| 5,719,818 A | 2/1998 | Tovim et al. | |
| 6,426,655 B2 * | 7/2002 | DeSoto et al. | 326/108 |
| 6,646,949 B1 | 11/2003 | Ellis et al. | |
| 6,826,074 B2 * | 11/2004 | Yamauchi | 365/154 |
| 2002/0141278 A1 | 10/2002 | Weitz | |
| 2003/0086304 A1 * | 5/2003 | Park | 365/189.07 |
| 2003/0151950 A1 * | 8/2003 | Tamada et al. | 365/185.19 |
| 2003/0206448 A1 | 11/2003 | Sung et al. | |

FOREIGN PATENT DOCUMENTS

EP 1 255 254 A2 11/2002

OTHER PUBLICATIONS

European Patent Office Examination Report dated May 24, 2005.

* cited by examiner

*Primary Examiner*—Huan Hoang
*Assistant Examiner*—Anthan T Tran
(74) *Attorney, Agent, or Firm*—Patterson & Sheridan, L.L.P.

(57) ABSTRACT

The invention relates to a driver circuit for driving a word line of a memory. The driver circuit comprises a driver unit for deactivating the word line after an access to a memory cell, a discharging means for discharging the word line, and a signal generator that generates two control signals. A first signal triggers the driver unit to deactivate the word line and triggers the discharging means to discharge the word line. A second signal triggers the discharging mean to stop discharging the word line.

21 Claims, 7 Drawing Sheets

PULSE CONTROLLED WORD LINE DRIVER

CROSS-REFERENCE TO RELATED APPLICATIONS

This application claims foreign priority benefits under 35 U.S.C. §119 to co-pending European patent application number EP 05 000 540.4, filed Jan. 12, 2005. This related patent application is herein incorporated by reference in its entirety.

BACKGROUND OF THE INVENTION

1. Field of the Invention

The invention relates to driver circuits that drive word lines of memories.

2. Description of the Related Art

Until recently, a major task in the design of row decoders and their word line drivers was a fast word line activation. But new dynamic and leakage power requirements call for an optimisation of word line drivers in regard to these new constraints. In conventional row decoders, the word line deactivation occurs late compared to the ending of a read or a write operation. As a result, a lot of power is wasted because of the long time duration the memory cells are opened.

More recent techniques are able to minimize the word line driver gate leakage current with an automatic suppression device, but they require a local DC level controller, which increases area, adds leakage currents and is not flexible for tuning.

SUMMARY OF THE INVENTION

It is therefore an object of the present invention to provide a word line driver circuit, whose leakage power and in particular whose dynamic power is reduced compared to conventional driver circuits. A memory circuit comprising the word line driver circuit and a method for the same purpose shall be also provided.

The driver circuit according to the invention drives a word line of a memory. The memory can be a ROM (i.e., read only memory) or an SRAM (i.e., static random access memory). The driver circuit comprises a driver unit, a discharging means and a first signal generator. The driver unit deactivates the word line after an access to a memory cell coupled to the word line. The access to the memory cell can be a read access or a write access. The discharging means discharges the word line when the word line is deactivated. The first signal generator generates a first control signal and a second control signal. The second control signal follows the first control signal. The first control signal triggers the driver unit to deactivate the word line. Furthermore the first control signal triggers the discharging means to start discharging the word line. Once the word line is discharged, the second control signal triggers the discharging means to stop discharging the word line. Keeping the word line at a pre-determined potential is thus not the task of the discharging means, but rather a task of the driver unit.

In contrast to conventional driver circuits driving word lines of memories, the driver circuit according to the invention causes the discharging means to turn off as soon as the word line is discharged. This helps to reduce the overall power consumption of the driver circuit. For example, in case the discharging means is realised as a MOS transistor, the gate leakage current of this transistor is eliminated after the discharging transistor has discharged the word line. Due to the required width of the discharging transistor, the invention helps to reduce the power consumption of the driver circuit significantly.

Another advantage of the driver circuit according to the invention is that the word line can be deactivated and discharged as soon as the read or write operation is completed. Using a signal from an external signal generator for this purpose allows for deactivating and discharging the word line faster as it can be done by employing word line selection signals for this purpose.

It can be advantageously provided that the time period between the first control signal and the second control signal can be controlled. Consequently, the time period during which the discharging means is activated can be as short as necessary for discharging the word line. Thus the power consumption caused by the discharging means is reduced as much as possible.

Instead of generating a first and a second control signal independently, a first pulse can advantageously be utilized. The first edge of the first pulse then represents the first signal, and the second edge of the first pulse represents the second signal.

Apart from deactivating the word line, the driver unit also activates the word line when data shall be read from or stored into a memory cell coupled to the word line.

The driver unit advantageously comprises at least two driver transistors, which are coupled to the word line. The first driver transistor is turned on during an activated period of the word line and, for instance, connects the word line to a supply voltage. During a deactivated period of the word line, the first driver transistor is turned off, and a second driver transistor is turned on. During that time, the second driver transistor keeps the word line, for instance, at ground potential.

Advantageously, the discharging means comprises a discharging transistor coupled to the word line.

In accordance with one advantageous configuration of the invention, the word line can be discharged faster by the discharging means than by the driver unit.

This capability of the discharging means can be realised by selecting a discharging transistor with a channel width that is wide enough to conduct an appropriate current through the channel of the discharging transistor.

The driver transistors are advantageously controlled by the first control signal and not by the second control signal. In contrast to this, the discharging transistor is controlled by the first and the second control signals. This makes it possible to use the first control signal for deactivating the word line and for starting discharging the word line. In contrast to this, the second control signal does not reactivate the word line, but only stops discharging the word line.

The memory circuit according to the invention comprises a plurality a memory cells, which are organised in rows and columns. Word lines are coupled to the rows of memory cells, respectively. Moreover, a plurality of driver circuits as described above are coupled to the word lines, respectively.

Alternatively, it can be provided that the memory circuit comprises only one first signal generator shared by the driver circuits instead of equipping each driver circuit with its own first signal generator.

Furthermore, the memory circuit advantageously comprises a plurality of bit lines, a dummy bit line and a dummy word line. Each bit line is coupled to a column of memory cells. The dummy bit line and the dummy word line are coupled to dummy memory cells. The signal transmission behaviors of the dummy bit line and the dummy word line are essentially characteristic of the signal transmission behavior of the bit lines and the word lines, respectively.

In accordance with one advantageous configuration of the invention, the memory circuit contains a second signal generator. The second signal generator generates a third control signal that is supplied to the dummy bit line. The third control signal tracks the height of the memory. The signal outputted by the dummy bit line is used for generating the first control signal. Moreover the signal outputted by the dummy bit line is supplied to the dummy word line. This signal tracks the width of the memory and the load of the word lines. After traversing the dummy word line, this signal is used for generating the second control signal.

The advantage of this concept is that the signals that are responsible for resetting and discharging the word lines are generated by the memory's internal self-timing. This makes it possible to close the memory cells as soon as the read or write operation has been performed. Furthermore, tracking the width of the memory ensures that, on the one hand, the discharging means is not turned off before the word line is completely discharged, and on the other hand, the time period during that the discharging means is turned on is as short as possible.

In order to generate the second control signal, it can advantageously be provided that the second signal generator comprises a gate with an AND function. This gate can be implemented, for instance, as an AND or a NAND gate. The gate is fed with the output signal of the dummy bit line and the output signal of the dummy word line on its input terminals. The output terminal of the gate provides the second control signal and in particular the first control signal.

A memory circuit usually contains a row decoder that receives row address signals and selects one of the driver circuits according to the row address signals in order to activate the word line coupled to the selected driver circuit. According to the invention, the second signal generator generates the third control signal when the row decoder receives the row address signals. This ensures a minimal cycle time and reduces dynamic power.

It can be also advantageously provided that the output signal of the dummy bit line caused by the third control signal triggers the reset of a clock DFF. Since most memories are nowadays edge sensitive, a clock DFF is needed to detect the clock signal of the user. When the clock DFF is reset due to the internal self-timing of the memory, it is available for the next clock activation. The clock DFF is the central timer of the memory. It controls the pre-charging of the bit lines, the ADD, DIN and RWB latches, the row decoder and the column multiplexer that selects the word and bit lines for a read or write operation.

The output signal of the dummy bit line also controls a sense amplifier of the memory that is needed in case of a read access to a memory cell. In this case, the sense amplifier is coupled to the corresponding bit line.

In accordance with the present invention, a method of deactivating a word line of a memory is comprised of the following steps:

generating a first control signal that triggers the deactivation of the word line after an access to a memory cell coupled to the word line and that triggers a discharging mean to start discharging the word line; and generating a second control signal that triggers the discharging mean to stop discharging the word line.

The method according to the invention offers the same advantages over conventional methods as the driver circuit.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
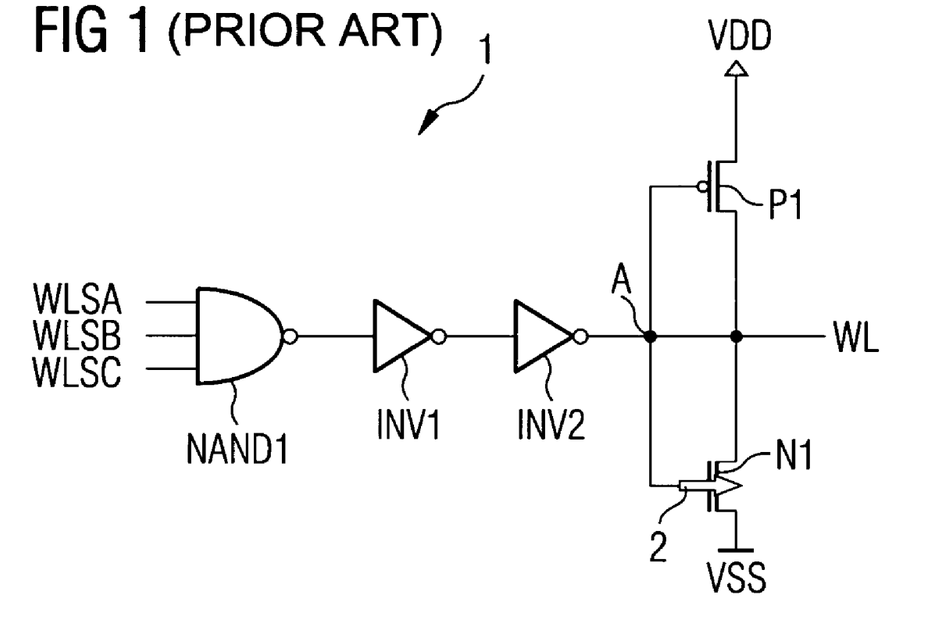
FIG. 1 shows a section of a conventional row decoder 1 according to prior art.

FIG. 1 shows a section of a conventional row decoder 1 with a driver circuit according to prior art. The task of the row decoder 1 is to decode row address signals in order to select one word line WL of a ROM or an SRAM. FIG. 1 shows, as an example, only the part of the row decoder 1 that affects a single word line WL. Thus, the entire row decoder 1 contains the components shown in FIG. 1 for each word line WL of the memory.

The row decoder 1 shown in FIG. 1 comprises a NAND gate NAND1, which is fed with word line selection signals WLSA, WLSB and WLSC on its input terminals. The output terminal of the NAND gate NAND1 feeds a serial connection of two inverters INV1 and INV2. The output of the inverter INV2 controls the gate voltages of two transistors N1 and P1. The transistor N1 is a MOS transistor with an n-channel, and the transistor P1 is a MOS transistor with a p-channel. Correspondingly, transistors having an n-channel are denoted with an N and transistors having a p-channel are denoted with a P in the following. One channel terminal of each of the transistors N1 and P1 is coupled to a word line WL, whereas the other connections of the transistors N1 and P1 are connected to ground VSS and a supply voltage VDD, respectively.

Figure 2:
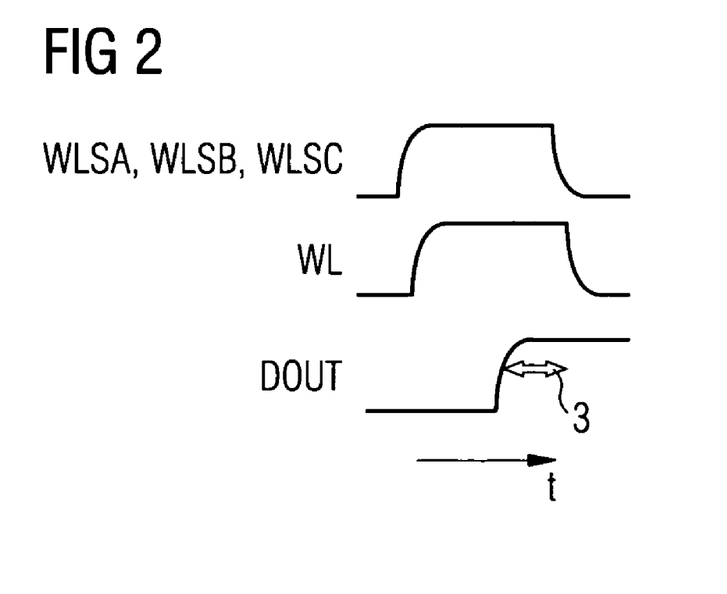
FIG. 2 shows diagrams illustrating the behavior of the word line WL shown in FIG. 1 when selected and when deactivated.

FIG. 2 illustrates the behavior of the word line WL in the course of a read or write access to a memory cell coupled to the word line WL. For that, the word line selection signals WLSA, WLSB, WLSC, the potential of the word line WL and an output signal DOUT of the memory are plotted against time t. A change in the output signal DOUT marks the end of a read or write access.

During a read or write access to a memory cell coupled to the word line WL, the word line selection signals WLSA, WLSB and WSLC are all at a logical high level. This causes the transistor N1 to be switched off and the transistor P1 to be on, thus applying the positive supply voltage VDD to the word line WL so that the word line WL is at a logical high level.

When the read or write access to the memory cell is completed, which is indicated by a transition of the output signal DOUT of the memory from a logical low level to a logical high level, the word line selection signals WLSA, WLSB, WLSC are switched back to the logical low level. Then the potential at a node A, which is the gate potential of the transistors N1 and P1, returns to the logical high level and the word line WL is no longer selected, meaning that the potential of the word line WL switches back to the logical low level.

While the word line WL is not selected, the transistor N1 is always switched on. This results in an increased power consumption of the row decoder 1 due to a gate leakage current of the transistor N1 as indicated by an arrow 2 in FIG. 1. Since one task of the transistor N1 is to discharge the word line WL after an access to a memory cell, the width of the transistor N1 has to be large enough to fulfill this task. In return the large width of the transistor N1 increases its gate leakage current. In the row decoder 1, the width of the transistor N1 is 10 times larger than a reference value, whereas the width of the transistor P1 is 20 times larger than the reference value.

Another drawback of the row decoder 1 shown in FIG. 1 and 2 is a long cycle time. The reason for this is that the window during that the word line WL is activated only depends on the word line selection signals WLSA, WLSB and WLSC. The word line selection signals WLSA, WLSB and WLSC come from the address predecoding stage, and they are relatively slow because they are generated from the clock DFF. This also becomes evident from FIG. 2. After the output signal DOUT is switched to the logical high level, a lot of time passes by and power is wasted as indicated by an arrow 3, until the word line WL is deactivated.

Figure 3:
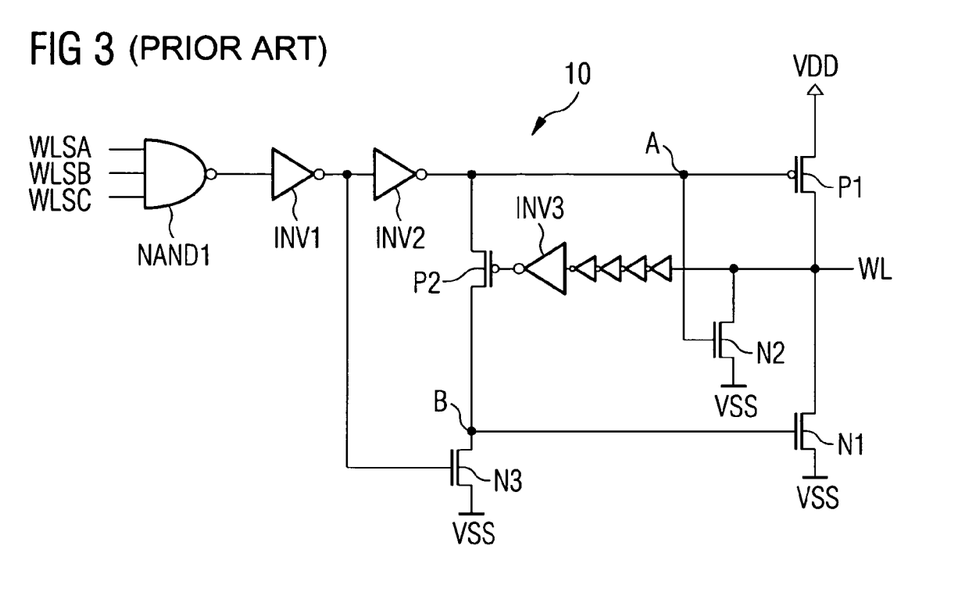
FIG. 3 shows a section of a conventional row decoder 10 according to prior art.

FIG. 3 shows a section of a further conventional row decoder 10 with a driver circuit according to prior art. The row decoder 10 is very similar to the row decoder 1 shown in FIG. 1 except for some additional transistors. The row decoder 1 comprises a NAND gate NAND1, inverters INV1 and INV2 as well as transistors N1 and P1 that are arranged in almost the same way as in the row decoder 1. However, in contrast to the row decoder 1, the task of the transistor N1 in the row decoder 10 is only to discharge the word line WL in case the word line WL is being deactivated. For this reason, the width of the transistor N1 is still 10 times larger than the reference value. (The width of the transistor P1 is 20 times larger than the reference value.) But the row decoder 10 comprises a transistor N2 in order to keep the word line WL at the ground potential VSS when the word line WL is not selected. Since a width of the transistor N2 as large as the reference value is sufficient for keeping the word line WL at the ground potential VSS, the gate leakage current of the transistor N2 is reduced compared to the gate leakage current of the transistor N1 of the row decoder 1 shown in FIG. 1.

Figure 4:
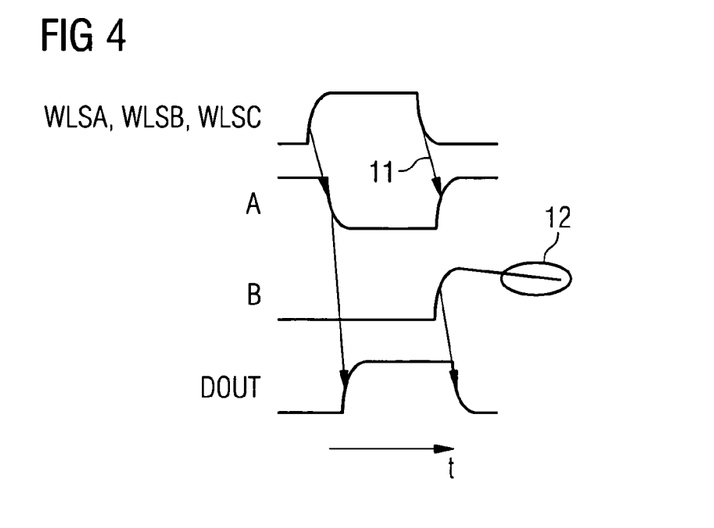
FIG. 4 shows diagrams illustrating the behavior of the word line WL shown in FIG. 3 when selected and when deactivated.

FIG. 4 illustrates the behavior of the word line WL coupled to the row decoder 10 in the course of a read or write access to a memory cell coupled to the word line WL. For that, the word line selection signals WLSA, WLSB, WLSC, the potentials at nodes A and B as well as the output signal DOUT of the memory are plotted against time t. The potential at the node A is identical to the gate potentials of the transistors P1 and N2, whereas the potential at the node B gives the gate potential of the transistor N1.

Activating the word line WL for a read or write access to a memory cell is performed in the exact same manner as in the row decoder 1. Since the transistor P2 is on during the read or write access, the gate potentials of the transistors N1 and N2 are at the logical low level during that time and thus switched off. However, when the word line WL shall be deactivated, firstly the potential at the node A is switched to the logical high level as indicated in FIG. 4 by an arrow 11. This causes both transistors N1 and N2 to switch on and the transistor P1 to switch off. Due to its large width, the transistor N1 then discharges the word line WL and brings the word line WL to the ground potential VSS. The transistor P2 and a serial connection INV3 of inverters are arranged in such a way that after a certain time (determined by the serial connection INV3 of inverters), the transistor P2 turns off. Since the transistor N3 is also off, the gate potential of the transistor N1 is then floating which means that its gate is neither connected to the supply voltage VDD nor to the ground potential VSS. However, since the transistor N3 generates a gate leakage current, the potential at the node B, which is also the gate potential of the transistor N1, slowly drops to the logical low level and switches the transistor N1 off. This is indicated in FIG. 4 by a circle 12. During the time needed by the parasitic gate leakage current of the transistor N3 to switch off the transistor N1, the transistor N1 also produces a parasitic gate leakage current, which increases the power consumption of the row decoder 10.

Figure 5:
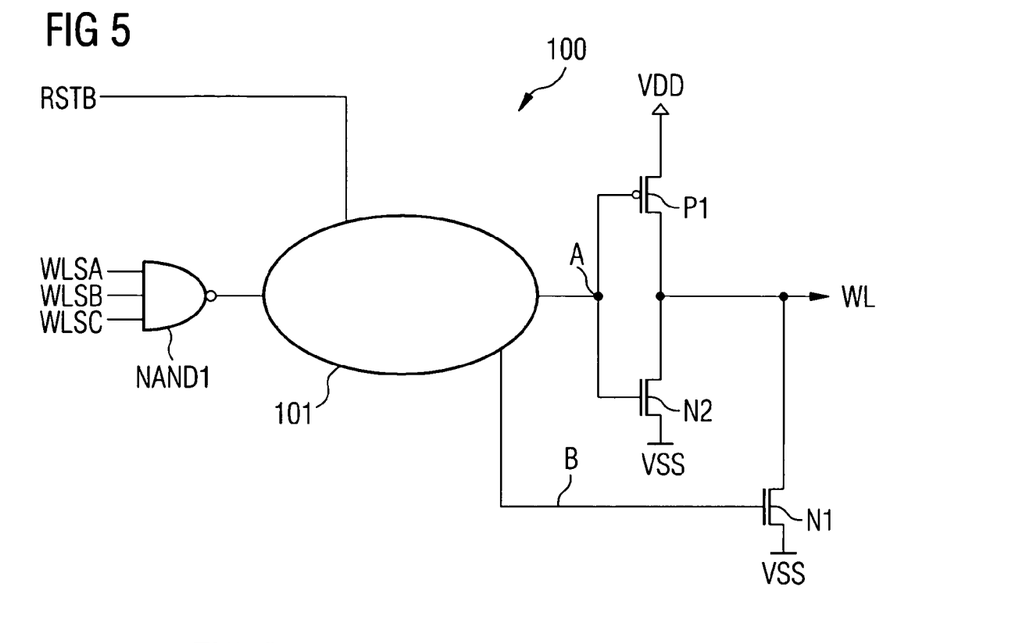
FIG. 5 shows a first exemplary embodiment of the driver circuit according to the invention.

The disadvantages of the conventional row decoders 1 and 10 are overcome by a row decoder 100 that is partially depicted in FIG. 5. FIG. 5 shows, as an example, only the part of the row decoder 100 that affects a single word line WL. The row decoder 100 comprises a driver circuit and serves as a first exemplary embodiment of the driver circuit according to the invention.

The row decoder 100 includes a NAND gate NAND1, a logic circuit 101 as well as transistors N1, N2 and P1. Word line selection signals WLSA, WLSB and WLSC feed the input terminals of the NAND gate NAND1. The output terminal of the NAND gate NAND1 and a reset terminal RSTB are connected to input terminals of the logic circuit 101. The logic circuit 101 generates control signals for controlling the transistors N1, N2 and P1 via their gate potentials. The gate terminals of the transistors N2 and P1 are coupled to a node A, whereas the gate terminal of the transistor N1 is coupled to a node B. The arrangement of the transistors N1, N2 and P2 with regard to the word line WL is identical to the arrangement in the row decoder 10 shown in FIG. 3. The widths of the transistors N1 and P1 are 10 and 20 times larger than a reference value, respectively. The width of the transistor N2 is as large as the reference value.

Figure 6:
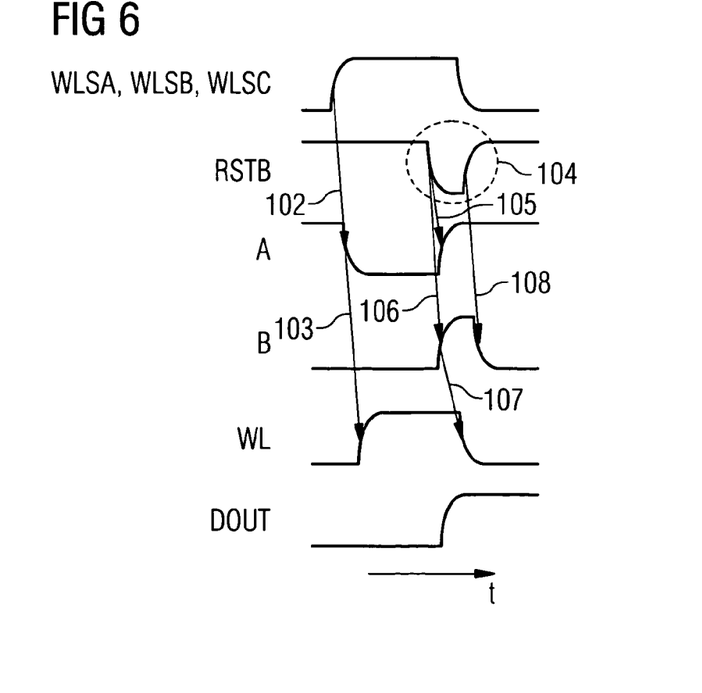
FIG. 6 shows diagrams illustrating the behavior of the word line WL shown in FIG. 5 when selected and when deactivated.

FIG. 6 illustrates the mode of operation of the row decoder 100 in the course of a read or write access to a memory cell coupled to the word line WL. For that, the word line selection signals WLSA, WLSB, WLSC, the reset signal feeding the reset terminal RSTB, the potentials at the nodes A and B, the potential at the word line WL as well as the output signal DOUT of the memory are plotted against time t.

Activating the word line WL for a read or write access to a memory cell is performed in the exact same manner as in the row decoders 1 and 10 and is indicated in FIG. 6 by arrows 102 and 103.

In order to deactivate the word line WL after the end of a read or write access to a memory cell, a pulse is generated by a control unit, which is not shown in FIG. 5, but will be explained below in more detail. The pulse is induced in the reset terminal RSTB as indicated in FIG. 6 by a dashed circle 104. When not operated, the reset terminal RSTB is at a logical high level. Thus, the pulse 104 induced in the reset terminal RSTB comprises a falling edge and a subsequent rising edge.

The falling edge of the pulse 104 causes the node A to return to the logical high level as indicated by an arrow 105 in FIG. 6. Moreover, the falling edge of the pulse 104 causes the node B to leave the logical low level and go to the logical high level as indicated by an arrow 106 in FIG. 6. As a result, the transistors N1 and N2 are switched on, whereas the transistor P1 is switched off so that the word line WL is discharged by the transistor N1 and is kept at the ground potential VSS by the transistor N2 as indicated by an arrow 107 in FIG. 6.

The falling edge of the pulse 104 is positioned in such a manner that the word line WL is discharged shortly after the output signal DOUT of the memory has switched from a logical low level to a logical high level. Since this transition of the output signal DOUT is a sign of the completion of the read or write access, only a very short time passes by after the completion of the read or write access until the word line WL is deactivated. Thus, the dynamic power is minimized at the end of an operating cycle by optimizing the word line window to close the memory cells as soon as the read or write operation is performed. Since the pulse 104 resetting the row decoder 100 is generated from the memory internal self-timing, the memory cells connected to the word line WL can be closed faster than using the slow word line selection signals WLSA, WLSB and WLSC.

Another drawback of the conventional row decoders 1 and 10 is also eliminated by the row decoder 100, namely the gate leakage current of the transistor N1 used for discharging the word line WL. This is realised by the rising edge of the pulse 104. The rising edge of the pulse 104 causes the node B to return to the logical low level as soon as the word line WL has been discharged. This is marked with an arrow 108 in FIG. 6. As a result, the transistor N1 is immediately turned off and cannot produce any gate leakage current any longer.

It is contemplated that the pulse 104 can be also inverted, meaning the rising edge of the pulse 104 is followed by the falling edge. In this case, the logic circuit 101 needs to be adapted to the inverted pulse 104.

Figure 7:
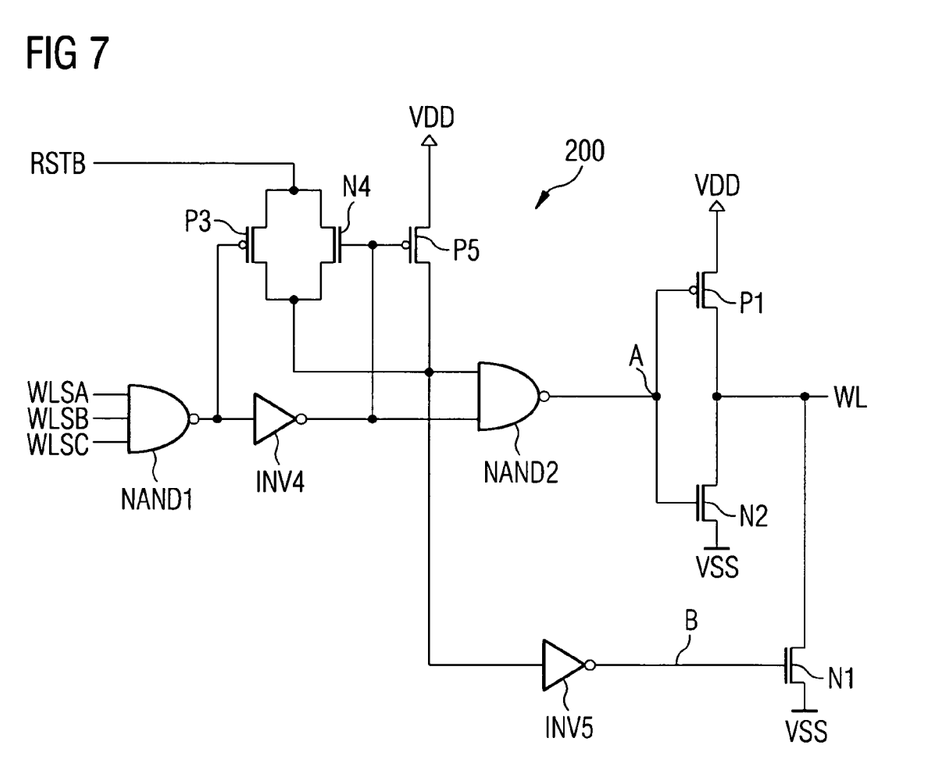
FIG. 7 shows a second exemplary embodiment of the driver circuit according to the invention.

In FIG. 7, another row decoder 200 is shown, which serves as a second exemplary embodiment of the driver circuit according to the invention. The row decoder 200 is partially identical to the row decoder 100 shown in FIG. 5. The only difference between the row decoders 100 and 200 is the detailed depiction of the logic circuit 101 in FIG. 7.

In the row decoder 200, the reset terminal RSTB is connected to the channel terminals of transistors N4 and P3. The other channel terminals of the transistors N4 and P3 are connected to a first input terminal of a NAND gate NAND2 and to the input terminal of an inverter INV5. The gate of the transistor P3 is controlled by the output signal of the NAND gate NAND1, whereas the output signal of the NAND gate NAND1 is inverted by an inverter INV4 before it is supplied to the gate terminal of the transistor N4. The output signal of the inverter INV4 also feeds the second input terminal of the NAND gate NAND2 and controls the gate of a transistor P5, the channel of which is inserted between the supply voltage VDD and the first input terminal of the NAND gate NAND2. The output terminals of the NAND gate NAND2 and the inverter INV5 form the nodes A and B, respectively.

The circuit arrangement of the logic circuit 101 as shown in FIG. 7 functions as illustrated in FIG. 6. The components of the logic circuit 101 shown in FIG. 7 are arranged in such a way that the falling edge of the pulse 104 affects both the node A and the node B. However, the rising edge of the pulse 104 only affects the node B.

An additional benefit of the row decoder 200 is the ability to select the word line WL faster due to a reduced gate load on the word line activation critical path, because the gate of the transistor N1 is no longer on this path. As the word line driver input load is reduced, it gives more flexibility to increase the length of the transistor P1 to reduce the sub-threshold leakage current without impacting too much the access time.

The width of the pulse 104 is not controlled locally in the row decoder 200 meaning that no additional control logic is needed in the row decoder 200. The pulse 104 is rather derived from the internal-self timing of the memory. One approach for generating the pulse 104 and especially for controlling its width makes use of the so-called double dummy line concept.

Generally, a dummy line replicates a corresponding word line or bit line. For that, the dummy line is connected to a number of dummy transistors. The number of the dummy transistors is the same as the number of transistors connected to the corresponding word line or bit line. Furthermore, the dummy line and the corresponding word line or bit line are matched to each other. Matching between these two lines means that the main characteristic structure features of both transmission lines, which impacts the line capacitance and the propagation delay of the transmission line, are identical, e.g., same length, same width, same thickness and same dielectricity of the isolation. Then the signal transmission behavior of the dummy line is essentially characteristic of the signal transmission behavior of the corresponding word line or bit line. For example, if the delay for reading the content of a memory cell via a bit line is increased, e.g., caused by semi-conductor process variations, the dummy bit line reflects this delay. Then the activation of a sense amplifier can be also delayed by the same additional delay. This leads to a self-adjusting timing architecture.

Figure 8:
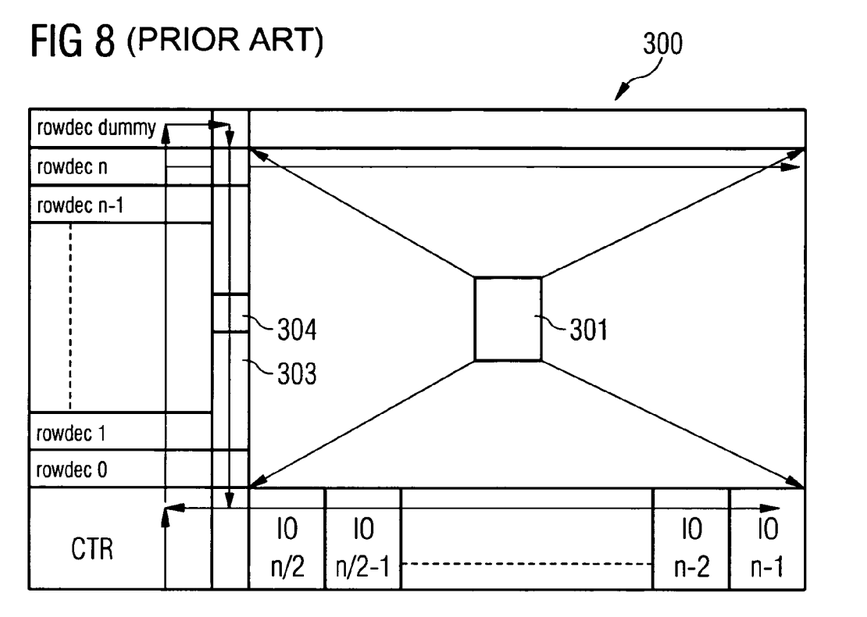
FIG. 8 shows a memory making use of a dummy bit line according to prior art.
Figure 9:
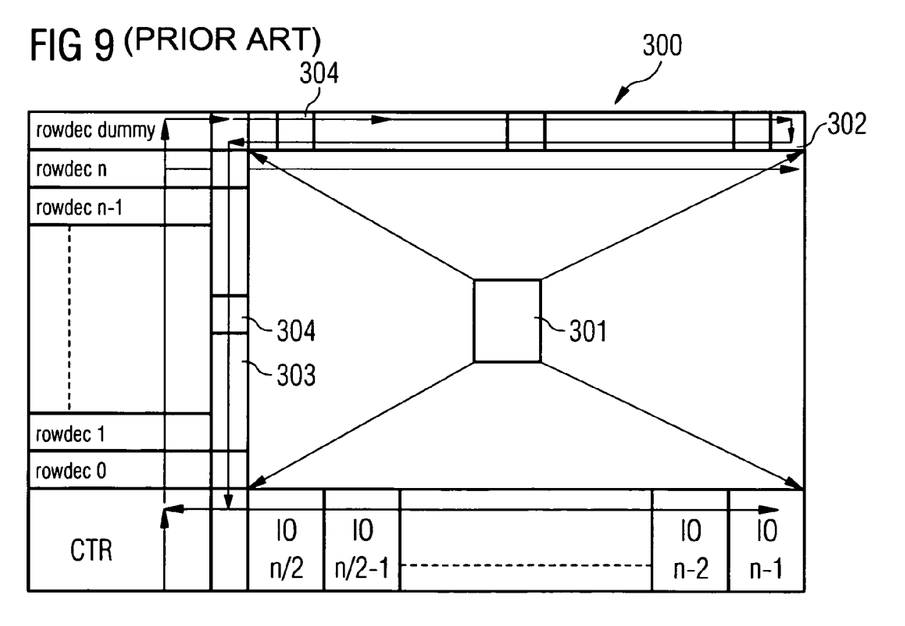
FIG. 9 shows a memory making use of a dummy bit line and a dummy word line according to prior art.

FIGS. 8 and 9 show schematically the internal arrangement of a conventional SRAM or ROM 300 according to prior art. The memory 300 comprises an array of memory cells 301 organised in n+1 rows and n−1 to n/2 columns. Each memory cell 301 is addressed by a row address signal and a column address signal. The row address signal is decoded in a row decoder to select one of the n+1 rows. In FIG. 8 and 9, the row decoder is composed of several sections denoted as rowdec 0 to rowdec n. Each section rowdec 0 to rowdec n of the row decoder drives one of the word lines WL. Every section rowdec 0 to rowdec n, for example, corresponds to the section of the row decoder 10 shown in FIG. 3. Each row of memory cells 301 is coupled to one of the word lines. When a row is selected, the corresponding word line exhibits a logical high level. In a similar way, the column address signal is decoded in a column decoder to select one of the n−1 to n/2 columns. Each column of memory cells 301 is coupled to one of the bit lines.

Furthermore, the memory 300 comprises a dummy word line 302 and a dummy bit line 303. The dummy word line 302 is connected to n+1 dummy memory cells 304, whereas the dummy bit line 303 is connected to n−1 to n/2 dummy memory cells 304. The dummy cells 304 are identical to the memory cells 301.

In FIG. 8, only the dummy bit line 303 is used for tracking the height of the memory 300. The voltage level of the dummy bit line 303 is used for resetting the clock DFF and for triggering the sense amplifier of the memory 300 in case of a read access.

In FIG. 9, both the dummy word line 302 and the dummy bit line 303 are used for tracking the width and the height of the memory 300.

Figure 10:
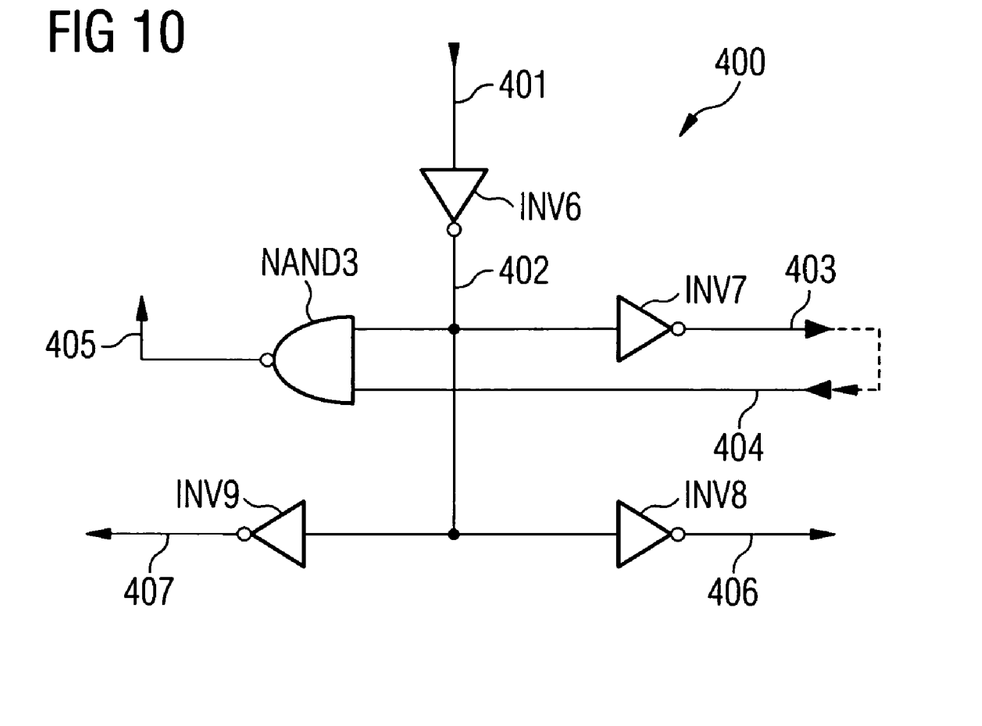
FIG. 10 shows a logic circuit 400 used for generating a pulse 104.

In FIG. 10, a logic circuit 400 is shown that generates the pulse 104 shown in FIG. 6 by making use of dummy word and dummy bit lines in order to reset the word lines WL driven by the row decoders 100 and 200 shown in FIG. 5 and 7. The logic circuit 400 comprises inverters INV6, INV7, INV8 and INV9 as well as a NAND gate NAND3. The inverter INV6 is fed with a signal 401 on its input terminal and produces a signal 402 on its output terminal. The output terminal of the inverter INV6 is connected to the input terminals of the inverters INV7, INV8 as well as INV9 and is also connected to the first input terminal of the NAND gate NAND3. The second input terminal of the NAND gate NAND3 is fed with a signal 404. On the output terminals of the NAND gate NAND3 and the inverters INV7, INV8 and INV9, signals 405, 403, 406 and 407 are respectively generated.

Figure 11:
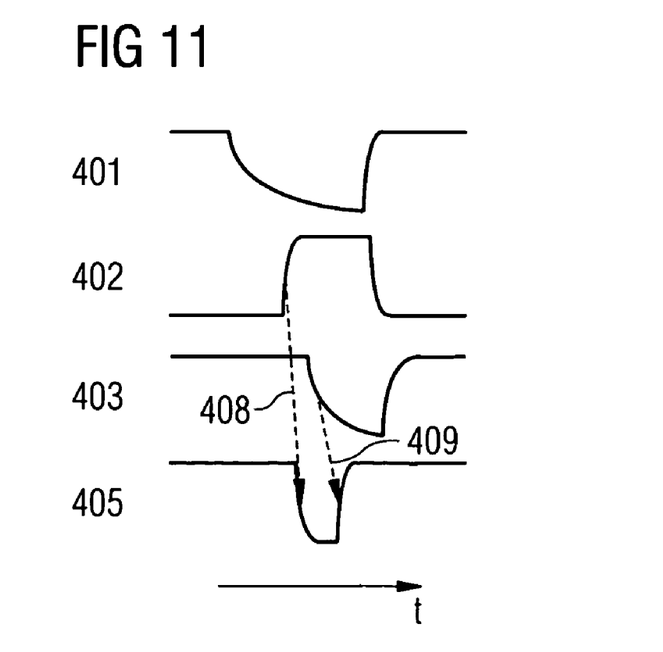
FIG. 11 shows diagrams illustrating the signals of the logic circuit 400 shown in FIG. 10.

FIG. 11 illustrates the mode of operation of the logic circuit 400. In FIG. 11, the signals 401, 402, 403 and 405 are plotted against time t.

Figure 12:
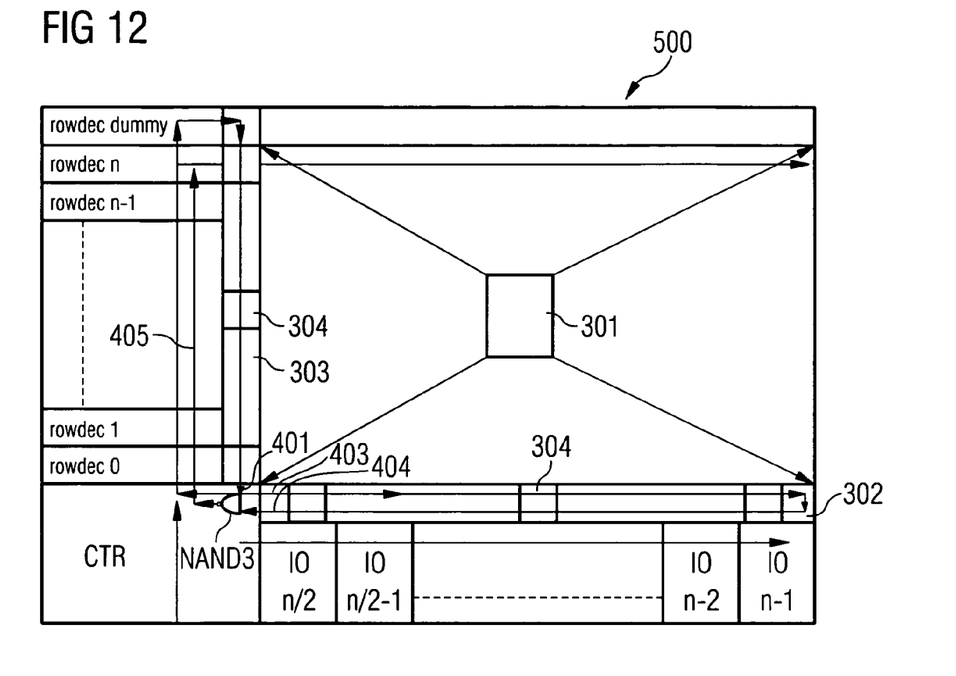
FIG. 12 shows an exemplary embodiment of the memory circuit according to the invention.

FIG. 12 shows the implementation of the logic circuit 400 in an SRAM or a ROM 500. The memory 500 serves as an exemplary embodiment of the memory circuit according to the invention. Most parts of the memory 500 are identical to the memories 300 shown in FIG. 8 and 9. The corresponding components in FIG. 12 are denoted with the same reference signs. The sections rowdec 0 to rowdec n of the memory 500 correspond to the circuit diagrams shown in FIG. 5 and 7.

In order to generate the pulse 104, firstly a pulse is generated that is supplied to the dummy bit line 303. This pulse is generated by a section rowdec dummy of the row decoder 100 or 200, which is connected to the dummy word line 302. The circuit diagram of the section rowdec dummy is identical to one of the circuit diagrams shown in FIGS. 5 and 7. In fact, the pulse feeding the dummy bit line 303 is generated when all three word line selection signals WLSA, WLSB and WLSC feeding any of the sections rowdec 0 to rowdec n become 1. At this moment, the section rowdec dummy connected to the dummy word line 302 creates a pulse. In other words, this means that every time a word line WL is selected by its word line selection signals WLSA, WLSB and WLSC, the section rowdec dummy creates a pulse that is supplied to the dummy bit line 303.

After passing the dummy bit line 303, the pulse 401 is obtained on the output terminal of the dummy bit line 303. As shown in FIG. 10, the signals 406 and 407 are obtained from the pulse 401. The signal 406 triggers the sense amplifier of the memory in case of a read access to the memory 500, and the signal 407 resets the clock DFF. Moreover, the pulse 403 is obtained from the pulse 401. The pulse 403 feeds the dummy word line 302 at its input terminal. After passing the dummy word line 302, the pulse 404 is obtained at the output terminal of the dummy word line 302.

The pulse 402 obtained after traversing only through the dummy bit line 303 and the pulse 404 obtained after additionally traversing through the dummy word line 302 feed the input terminals of the NAND gate NAND3. As a result, the NAND gate NAND3 outputs a pulse 405 as shown in FIG. 11. In FIG. 11, arrows 408 and 409 also indicate how the pulse 402 forms the falling edge of the pulse 405 and how the pulse 404 forms the rising edge of the pulse 405. Finally, the pulse 405 is used to feed the reset terminals RSTB of the row decoders 100 and 200 shown in FIGS. 5 and 7. Consequently, the pulses 405 and 104 are identical.

It can be provided that the pulse 405 is not only supplied to the section of the row decoder 100 or 200 with the activated word line WL, but that the pulse 405 is supplied to all sections rowdec 0 to rowdec n.

The memory 500 is advantageous over the conventional memory 300 because the pulse 104, which resets and discharges the word lines WL, is generated by the memory's internal self-timing. Tracking the height of the memory 500 by employing the dummy bit line 303 makes it possible to close the memory cells 301 as soon as the read or write operation has been performed. Furthermore, tracking the width of the memory 500 by using the dummy word line 302 ensures that, on the one hand, the discharging transistor N1 is not turned off before the word line WL is completely discharged, and on the other hand, the time period during which the discharging transistor N1 is turned on is as short as possible.

While the foregoing is directed to embodiments of the present invention, other and further embodiments of the invention may be devised without departing from the basic scope thereof, and the scope thereof is determined by the claims that follow.

What is claimed is:

1. A memory circuit, comprising:
    a plurality a memory cells organized in rows and columns;
    a plurality of word lines, each coupled to a respective row of memory cells;
    a plurality of driver circuits, each coupled to a respective word line, each driver circuit comprising:
        a driver unit for deactivating the respective word line after an access to a memory cell coupled to the respective word line;
        a discharging means for discharging the respective word line; and
        a first signal generator configured to generate a first control signal and a subsequent second control signal, wherein the first control signal triggers the driver unit to deactivate the respective word line and triggers the discharging means to start discharging the respective word line, and wherein the second control signal triggers the discharging means to stop discharging the respective word line;
    a plurality of bit lines, each coupled to a respective column of memory cells;
    a dummy bit line having a signal transmission behavior which is substantially similar to the signal transmission behavior of the bit lines;
    a dummy word line having a signal transmission behavior which is substantially similar to the signal transmission behavior of the word lines; and
    a second signal generator configured to provide the dummy bit line with a third control signal, wherein an output signal of the dummy bit line is provided to the dummy word line, wherein the output signal of the dummy bit line is utilized for triggering the first signal generator of at least one driver circuit to generate the first control signal, and wherein an output signal of the dummy word line is utilized for triggering the first signal generator of the at least one driver circuit to generate the second control signal.

2. The memory circuit of claim 1, wherein the second signal generator comprises a gate with an AND function, the gate having input terminals connected to the output signal of the dummy bit line and the output signal of the dummy word line, the gate having an output signal for triggering the first signal generator of the at least one driver circuit to generate the first and the second control signals.

3. The memory circuit of claim 2, further comprising:
a row decoder that receives row address signals and selects one of the driver circuits according to the received row address signals to activate the word line coupled to the selected driver circuit, wherein the generation of the third control signal by the second signal generator is triggered when the row decoder receives the row address signals.

4. The memory circuit of claim 3, wherein the output signal of the dummy bit line triggers a reset of a clock DFF and controls a sense amplifier for a memory read access, wherein the sense amplifier is selectively coupled to one of the bit lines.

5. The driver circuit of claim 1, wherein a time period between the first control signal and the second control signal is adjustable.

6. The driver circuit of claim 1, wherein the first signal generator is configured to generate a first pulse, wherein a first edge of the first pulse is the first control signal and a second edge of the first pulse is the second control signal.

7. The driver circuit of claim 1, wherein the driver unit is further configured to activate the word line before an access to a memory cell coupled to the word line.

8. The driver circuit of claim 1, wherein the driver unit comprises at least a first driver transistor and a second driver transistor coupled to the word line, wherein the first driver transistor is switched on during an activated period of the word line and the second driver transistor is switched on during a deactivated period of the word line.

9. The driver circuit of claim 1, wherein the discharging circuit comprises a discharging transistor coupled to the word line.

10. The driver circuit of claim 1, wherein the discharging circuit is configured to discharge the word line faster than the driver unit.

11. The driver circuit of claim 8, wherein the discharging circuit comprises a discharging transistor coupled to the word line, and wherein a channel width of the discharging transistor is larger than a channel width of the second driver transistor.

12. The driver circuit of claim 11, wherein the first and second driver transistors are controlled by the first control signal and not by the second control signal, and wherein the discharging transistor is controlled by the first and the second control signal.

13. A method for deactivating a word line of a memory circuit, comprising:
generating a first control signal for triggering the deactivation of the word line after an access to a memory cell coupled to the word line and for triggering a discharging means to start discharging the word line;
generating a second control signal for triggering the discharging means to stop discharging the word line, wherein the memory circuit comprises:
a plurality of memory cells organized in rows and columns;
a plurality of word lines, each coupled to a respective row of memory cells;
a plurality of bit lines, each coupled to a respective column of memory cells;
a dummy bit line having a signal transmission behavior which is substantially similar to a signal transmission behavior of the bit lines; and
a dummy word line having a signal transmission behavior which is substantially similar to a signal transmission behavior of the word lines; and
generating a third control signal which feeds the dummy bit line, wherein an output signal of the dummy bit line feeds the dummy word line, wherein an output signal of the dummy bit line triggers the generation of the first control signal, and wherein an output signal of the dummy word line triggers the generation of the second control signal.

14. The method of claim 13, wherein a time period between the first control signal and the second control signal is adjustable.

15. The method of claim 13, wherein a first pulse is generated, a first edge of the first pulse being the first control signal and a second edge of the first pulse being the second control signal.

16. The method of claim 13, wherein the word line is activated before an access to a memory cell coupled to the word line.

17. The method of claim 13, wherein a first driver transistor coupled to the word line is switched on during an activated period of the word line and wherein a second driver transistor coupled to the word line is switched on during an deactivated period of the word line.

18. The method of claim 13, wherein a discharging transistor discharges the word line.

19. The method of claim 17, wherein a discharging transistor discharges the word line, and wherein a channel width of the discharging transistor is larger than a channel width of the second driver transistor.

20. The method of claim 19, wherein the driver transistors are controlled by the first control signal and not by the second control signal, and wherein the discharging transistor is controlled by the first and the second control signals.

21. The method of claim 13, wherein the output signal of the dummy bit line triggers a reset of a clock DFF and controls a sense amplifier for a memory read access, wherein the sense amplifier is selectively coupled to one of the bit lines.

* * * * *